(12) United States Patent
Ohkubo et al.

(10) Patent No.: US 7,741,692 B2
(45) Date of Patent: Jun. 22, 2010

(54) INTEGRATED CIRCUIT DEVICE WITH TEMPERATURE MONITOR MEMBERS

(75) Inventors: Hiroaki Ohkubo, Kanagawa (JP); Yasutaka Nakashiba, Kanagawa (JP); Naoyoshi Kawahara, Kanagawa (JP); Hiroshi Murase, Kanagawa (JP); Naoki Oda, Tokyo (JP); Tokuhito Sasaki, Tokyo (JP); Nobukazu Ito, Tokyo (JP)

(73) Assignees: NEC Electronics Corporation, Kawasaki, Kanagawa (JP); NEC Corporation, Tokyo (JP)

( * ) Notice: Subject to any disclaimer, the term of this patent is extended or adjusted under 35 U.S.C. 154(b) by 243 days.

(21) Appl. No.: 11/087,587

(22) Filed: Mar. 24, 2005

(65) Prior Publication Data
US 2005/0218470 A1 Oct. 6, 2005

(30) Foreign Application Priority Data
Mar. 30, 2004 (JP) ............................. 2004-101092

(51) Int. Cl.
*H01L 31/058* (2006.01)
(52) U.S. Cl. .................................. 257/467; 257/E23.08
(58) Field of Classification Search ................. 257/467, 257/E23.08
See application file for complete search history.

(56) References Cited

U.S. PATENT DOCUMENTS 5,281,845 A * 1/1994 Wang et al. .................. 257/467
5,448,103 A * 9/1995 de Wit ......................... 257/536
5,844,208 A * 12/1998 Tustaniwskyj et al. ...... 219/494
6,841,843 B2 * 1/2005 Ohkubo et al. .............. 257/467
6,956,289 B2 * 10/2005 Kunikiyo .................... 257/758

FOREIGN PATENT DOCUMENTS

| JP | 1-302849 | 12/1989 |
|---|---|---|
| JP | 09-145481 | 6/1997 |
| JP | 9-229778 | 9/1997 |
| JP | 10-135005 | 5/1998 |
| JP | 11-330051 | 11/1999 |
| JP | 2003-344181 | 12/2003 |

* cited by examiner

*Primary Examiner*—Howard Weiss
(74) *Attorney, Agent, or Firm*—McGinn IP Law Group, PLLC

(57) ABSTRACT

In a semiconductor integrated circuit device, a logic circuit section is provided at the top surface of a P-type silicon substrate and a multi-level wiring layer. The device is further provided with a temperature sensor section in which a first temperature monitor member of vanadium oxide is provided above the multi-level wiring layer. A second temperature monitor member of Ti is provided at a lowermost layer of the multi-level wiring layer. The first and second temperature monitor members are connected in series between a ground potential wire and a power-source potential wire, with an output terminal connected to the node of both members. The temperature coefficient of the electric resistivity of the first temperature monitor member is negative, while that of the second temperature monitor member is positive.

10 Claims, 4 Drawing Sheets

INTEGRATED CIRCUIT DEVICE WITH TEMPERATURE MONITOR MEMBERS

BACKGROUND OF THE INVENTION

1. Field of the Invention

The present invention relates to an integrated circuit device with a built-in monolithic temperature sensor.

2. Description of the Related Art

Recently, there are growing needs for monitoring the operation temperature of an integrated circuit device for the purpose of preventing thermal breakdown of devices in the integrated circuit device and stabilizing the operation of a device whose characteristic has a temperature dependence.

In this respect, Japanese Patent Laid-Open Publication No. H1-302849, for example, discloses a technique of protecting an LSI (Large Scale Integrated circuit-) in a semiconductor integrated circuit device from thermal breakdown by a temperature rise by providing a temperature sensor on the same substrate as that of the LSI, deciding that the LSI is abnormally overheated when the temperature detected by the temperature sensor exceeds a predetermined value and then shutting down the LSI. Japanese Patent Laid-Open Publication No. H9-229778, for example, proposes the technique of using a parasitic pn junction diode as such a temperature sensor.

The technique that uses a parasitic pn diode as a temperature sensor has a problem such that as the temperature coefficient of the parasitic pn junction diode is as low as 0.2 (%/K), a sufficient SNR (Signal-to-Noise Ratio) cannot be acquired.

Japanese Patent Laid-Open Publication No. 2003-344181, for example, discloses a technique of measuring the temperature by providing two frequency-dividing circuits in each of which a resistance having a positive temperature coefficient and a resistance having a negative temperature coefficient are connected in series. In the art disclosed in Japanese Patent Laid-Open Publication No. 2003-344181, the diffusion resistance of a P-type diffusion layer is used as the resistance whose electric resistivity has a positive temperature coefficient, and a polysilicon layer is used as the resistance whose electric resistivity has a negative temperature coefficient.

However, the electric resistivitys of the diffusion resistance and polysilicon used in Japanese Patent Laid-Open Publication No. 2003-344181 have considerably small temperature coefficients. Even when those resistances are connected in series, the temperature cannot be measured with sufficiently high precision.

The present inventors have developed a technique of forming an vanadium oxide film as a resistance having an electric resistivity whose temperature coefficient has a large absolute value, and has disclosed it in Japanese Patent Laid-Open Publication No. H11-330051.

The prior art technique suffers the following problems. When a temperature sensor is formed in a semiconductor integrated circuit device using a special material, such as vanadium oxide, which is not used in the normal semiconductor process, the special material contaminates the semiconductor integrated circuit device, which may adversely affect the operation of the other portion of the semiconductor integrated circuit device than the temperature sensor. The special material is also likely to contaminate the manufacture equipment for the semiconductor integrated circuit device so that other semiconductor integrated circuit devices manufactured by that equipment are also contaminated.

SUMMARY OF THE INVENTION

Accordingly, it is an object of the present invention to provide an integrated circuit device which has a high-accuracy temperature sensor and can be manufactured without contaminating the integrated circuit device and its manufacture equipment.

An integrated circuit device according to the present invention comprises a substrate, a multi-layer wiring layer provided on the substrate, a first temperature monitor member which is provided on a layer overlying the multi-layer wiring layer, whose electric resistivity has a negative temperature coefficient and to whose one end portion a first reference potential is applied, and a second temperature monitor member whose one end portion is connected to an other end portion of the first temperature monitor member, whose electric resistivity has a positive temperature coefficient and to whose other end portion a second reference potential different from the first reference potential is applied.

According to the present invention, because the temperature coefficient of the electric resistivity of the first temperature monitor member is negative and that of the second temperature monitor member is positive, the potential at the node between the first temperature monitor member and the second temperature monitor member has a large temperature dependence. Accordingly, the temperature can be measured accurately by measuring the potential at the node between the first temperature monitor member and the second temperature monitor member. Even when a special material whose resistance has a large temperature coefficient is used for the first temperature monitor member, forming the first temperature monitor member above the multi-layer wiring layer prevents contamination of the substrate and the multi-layer wiring layer and contamination of the manufacture equipment which manufacture the substrate and the multi-layer wiring layer.

The temperature dependence of the electric resistivity of the first temperature monitor member may be non-linear, and the temperature dependence of the electric resistivity of the second temperature monitor member may be linear. As the temperature coefficient of the first temperature monitor member changes according to the temperature, the temperature dependence of the potential at the node between the first temperature monitor member and the second temperature monitor member can be set large in the measuring temperature range.

It is preferable that the first temperature monitor member should be formed of vanadium oxide. Accordingly, a material whose electric resistivity has a negative temperature coefficient whose absolute value is large can be used for the first temperature monitor member.

The second temperature monitor member should preferably be formed of a metal or an alloy. This can allow the second temperature monitor member to be formed easily. In this case, the second temperature monitor member may be formed of one metal selected from a group of Al, Ti, Ni, W, Ta and Be, or an alloy of the metal, or an alloy essentially consisting of two or more metals in the group. Alternatively, the second temperature monitor member may be formed of a metal nitride such as TiN.

It is preferable that the second temperature monitor member should be formed of barium strontium titanate or barium titanate. Accordingly, a material whose electric resistivity has a positive temperature coefficient whose absolute value is large can be used for the second temperature monitor member. In this case, it is preferable that the second temperature monitor member should be laid out below a lowermost wiring layer of the multi-layer wiring layer. Therefore, in this case the second temperature monitor member can be formed before the multi-layer wiring layer is formed, thus preventing the wires of the multi-layer wiring layer from being influenced by the heat applied when the second temperature monitor member is formed.

According to the present invention, as the potential at the node between the first temperature monitor member and the second temperature monitor member has a large temperature dependence, the temperature can be measured accurately. Further, the first temperature monitor member is formed overlying the multi-layer wiring layer, making it possible to prevent the material for the first temperature monitor member from contaminating the substrate and the multi-layer wiring layer, and the manufacture equipment for the substrate and the multi-layer wiring layer as well.

DETAILED DESCRIPTION OF THE PREFERRED EMBODIMENT

Figure 1:
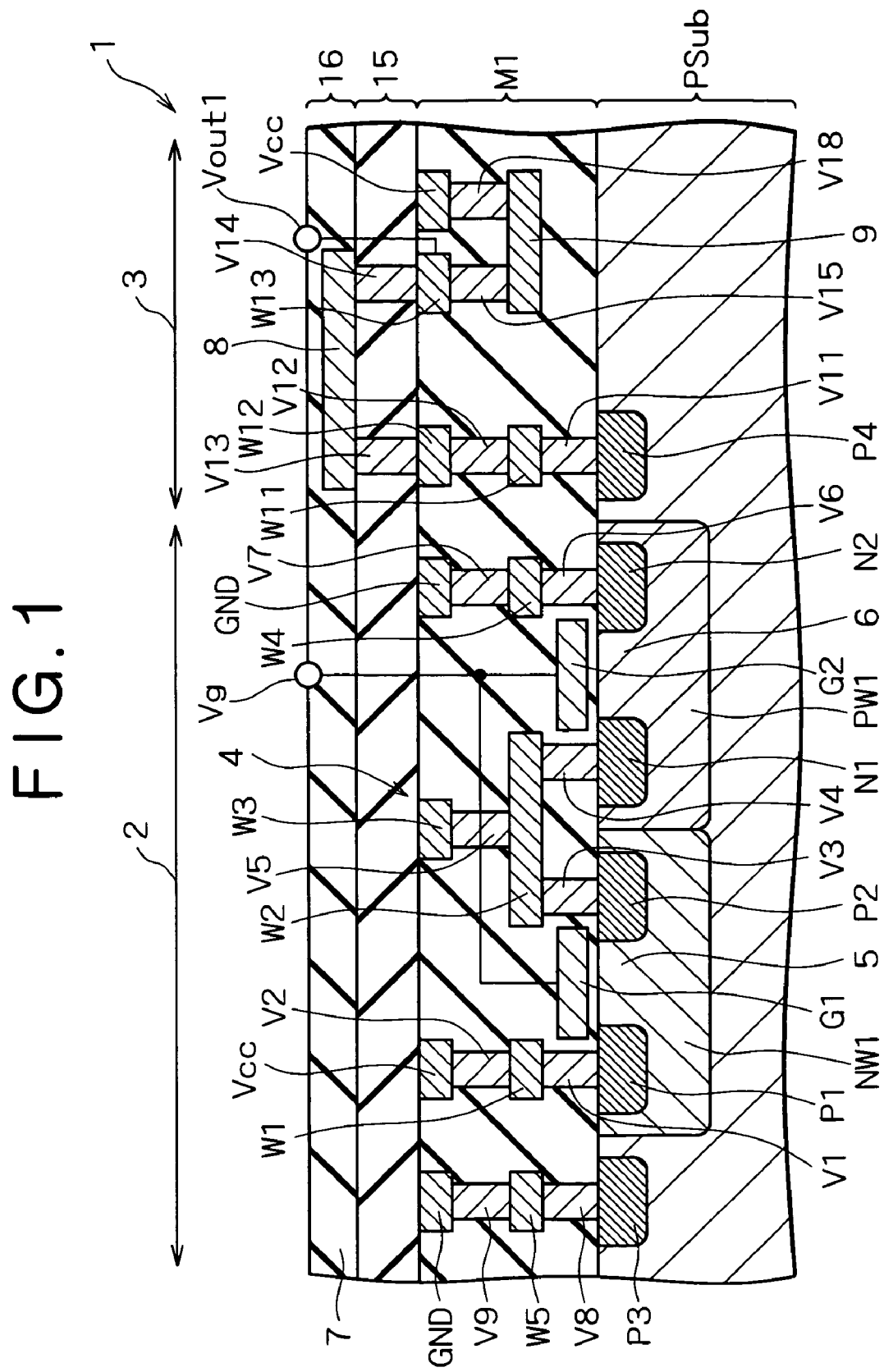
FIG. 1 is a cross-sectional view showing a semiconductor integrated circuit according to a first embodiment of the invention.
Figure 2:
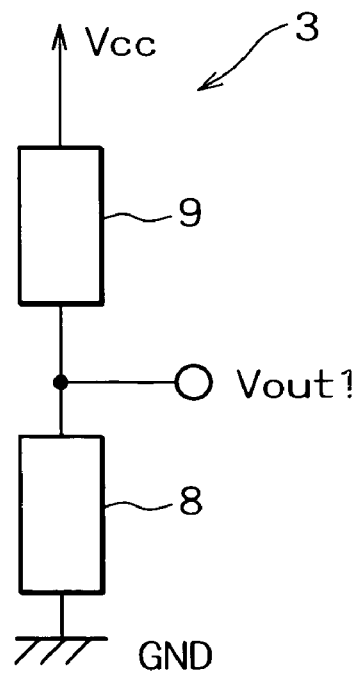
FIG. 2 is an equivalent circuit diagram showing the temperature sensor section of the semiconductor integrated circuit device shown in FIG. 1.
Figure 3:
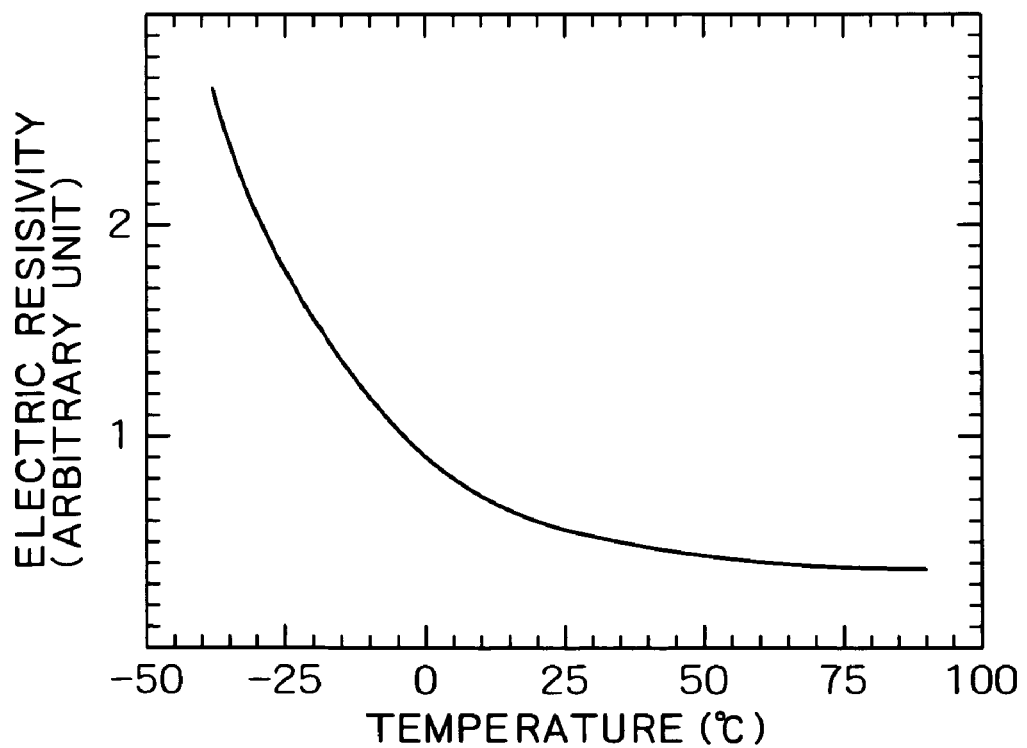
FIG. 3 is a graph showing the temperature dependence of the electric resistivity of vanadium oxide, showing the temperature on the abscissa and the electric resistivity of vanadium oxide on the ordinate.

Preferred embodiments of the present invention will be described specifically below with reference to the accompanying drawings. To begin with, the first embodiment of the invention will be discussed. FIG. 1 is a cross-sectional view showing a semiconductor integrated circuit device according to a first embodiment of the present invention, and FIG. 2 is an equivalent circuit diagram showing the temperature sensor section of the semiconductor integrated circuit device shown in FIG. 1. FIG. 3 is a graph showing the temperature dependence of the electric resistivity of vanadium oxide, showing the temperature on the abscissa and the electric resistivity of vanadium oxide on the ordinate. The semiconductor integrated circuit device according to the embodiment is formed on a single silicon chip.

As shown in FIG. 1, the semiconductor integrated circuit device 1 of the embodiment includes a P-type silicon substrate PSub, a multi-layer wiring layer M1 formed on the P-type silicon substrate PSub, an insulating layer 15 formed on the multi-layer wiring layer M1, and a sheet layer 16 formed on the insulating layer 15. The multi-layer wiring layer M1 is the lamination of plural wiring layers and plural insulating layers alternately laminated. Unlike the wiring layer of the multi-layer wiring layer M1, the sheet layer 16 does not have ordinary wirings formed thereon. The semiconductor integrated circuit device 1 is provided with a logic circuit section 2 constituted by a predetermined region of the top surface of the P-type silicon substrate PSub and the multi-layer wiring layer M1. The semiconductor integrated circuit device 1 is also provided with a temperature sensor section 3 constituted by the top surface of the P-type silicon substrate PSub, that region of the multi-layer wiring layer M1 where the logic circuit section 2 is not formed, the insulating layer 15, and the sheet layer 16.

A CMOS (Complementary Metal Oxide Semiconductor) circuit 4, for example, is provided in the logic circuit section 2. In the CMOS circuit 4, an N well NW1 and a P well PW1 are formed at the top surface of the P-type silicon substrate PSub in such a way as to be adjacent to each other. Two $p^+$ diffusion regions P1 and P2, which becomes a source/drain region, are formed, apart from each other, at the top surface of the N well NW1. Two $n^+$ diffusion regions N1 and N2, which becomes the source/drain region, are formed, apart from each other, at the top surface of the P well PW1. A channel region 5 is formed between the $p^+$ diffusion regions P1 and P2 in the N well NW1 and a channel region 6 is formed between the $n^+$ diffusion regions N1 and N2 in the P well PW1.

A gate insulating layer (not shown) is provided at that region in the multi-layer wiring layer M1 which includes regions directly above the channel regions 5 and 6, and gate electrodes G1 and G2 made of, for example, polysilicon, are respectively provided at the regions directly above the channel regions 5 and 6. The gate electrodes G1 and G2 are commonly connected to a gate terminal Vg. The channel region 5, the $p^+$ diffusion regions P1 and P2 as the source/drain region, the gate insulating layer and the gate electrode G1 form a P-type MOS transistor. The channel region 6, the $n^+$ diffusion regions N1 and N2 as the source/drain region, the gate insulating layer and the gate electrode G2 form an N-type MOS transistor.

A via V1 is provided on the $p^+$ diffusion region P1 in the multi-layer wiring layer M1 in such a way as to be connected to the $p^+$ diffusion region P1, and a wire W1 is provided on the via V1 in such a way as to be connected to the via V1. A via V2 is provided on the wire W1 in such a way as to be connected to the wire W1, and a power-source potential wire Vcc is provided on the via V2 in such a way as to be connected to the via V2. Accordingly, the $p^+$ diffusion region P1 is connected to the power-source potential wire Vcc via the via V1, the wire W1 and the via V2.

A via V3 is provided on the $p^+$ diffusion region P2 in the multi-layer wiring layer M1 in such a way as to be connected to the $p^+$ diffusion region P2, and a via V4 is provided on the $n^+$ diffusion region N1 in such a way as to be connected to the $n^+$ diffusion region N1. A wire W2 is provided on the vias V3 and V4 in such a way as to be connected to the vias V3 and V4. A via V5 is provided on the wire W2 in such a way as to be connected to the wire W2, and a wire W3 is provided on the via V5 in such a way as to be connected to the via V5. Accordingly, the $p^+$ diffusion region P2 and the $n^+$ diffusion region N1 are connected to the wire W3 by the vias V3 and V4, the wire W2 and the via V5.

Further, a via V6 is provided on the $n^+$ diffusion region N2 in the multi-layer wiring layer M1 in such a way as to be connected to the $n^+$ diffusion region N2, and a wire W4 is provided on the via V6 in such a way as to be connected to the via V6. A via V7 is provided on the wire W4 in such a way as to be connected to the wire W4, and a ground potential wire GND is provided on the via V7 in such a way as to be connected to the via V7. Accordingly, the $n^+$ diffusion region N2 is connected to the ground potential wire GND through the via V6, the wire W4 and the via V7.

A p+ diffusion region P3 is formed at that region of the top surface of the P-type silicon substrate PSub which is other than the region where the N-well NW1 and the P well PW1 are formed. A via V8, a wire W5, a via V9 and a ground potential wire GND are provided on the p+ diffusion region P3 in the multi-layer wiring layer M1 in order in the bottom-to-top direction, and the p+ diffusion region P3 is connected to the ground potential wire GND through the via V8, the wire W5 and the via V9.

The logic circuit section 2 performs processes, such as arithmetic and storing operations. The logic circuit section 2 may include a circuit which performs data processing on the results of measurements done by the temperature sensor section 3. The logic circuit section 2 is provided with other elements than the CMOS circuit 4, which are not shown in FIG. 1.

A p+ diffusion region P4 is formed at a part of the top surface of the P-type silicon substrate Psub in the temperature sensor section 3. A via V11 is provided on the p+ diffusion region P4 in the multi-layer wiring layer M1 in such a way as to be connected to the p+ diffusion region P1, and a wire W11 is provided on the via V11 in such a way as to be connected to the via V11. A via V12 is provided on the wire W11 in such a way as to be connected to the wire W11, and a wire W11 is provided on the via V12 in such a way as to be connected to the via V12. A via V13 is provided at that portion of the insulating layer 15 which lies on the wire W12 in such a way as to be connected to the wire W12.

Further, a temperature monitor member 8 is provided at that portion of the sheet layer 16 which lies on the via V13. That is, the temperature monitor member 8 is provided above the multi-layer wiring layer M1. The temperature monitor member 8 has a quadrilateral sheet-like shape as seen from the direction perpendicular to the top surface of the P-type silicon substrate Psub, with one side having a length of, for example, 10 to 100 μm and a thickness of, for example, 0.1 to 0.2 μm. The opposite two sides of the temperature monitor member 8 are respectively provided with electrodes (not shown) one of which is connected to the via V13.

The temperature monitor member 8 is formed of a material whose electric resistivity has a negative temperature coefficient, e.g., vanadium oxide. Stable compounds of vanadium oxide are, for example, $VO_2$ and $V_2O_5$, and vanadium oxide is expressed by the chemical formula, $VO_x$, where x is around "2". The volume resistivity of the vanadium oxide when the temperature is 25° C. is, for example, 0.01 to 10 (Ω·cm) on the silicon wafer, and the temperature coefficient, which differs depending on the manufacture method, is about −2.0 (%/K). As shown in FIG. 3, the temperature dependence of the electric resistivity of vanadium oxide is non-linear. The higher the temperature is, the lower the electric resistivity becomes. Also, the higher the temperature is, the smaller the absolute value of the temperature coefficient of the electric resistivity, i.e., the absolute value of the inclination of the graph shown in FIG. 3, becomes. The resistance of the temperature monitor member 8 is, for example, several thousand to several ten thousand Ω, e.g., 25 kΩ.

A via V14 is provided at that portion of the insulating layer 15 which lies under the temperature monitor member 8 in such a way as to be connected to the other electrode (not shown) of the temperature monitor member 8. A wire W13 is provided at that portion of the multi-layer wiring layer M1 which lies under the via V14 in such a way as to be connected to the via V14. An output terminal Vout1 is connected to the wire W13. A via V15 is provided under the wire W13 in such a way as to be connected to the wire W13, and a temperature monitor member 9 is provided under the via V15.

The temperature monitor member 9 is formed of a material whose electric resistivity has a positive temperature coefficient, e.g., titanium (Ti). The temperature dependence of the electric resistivity of temperature monitor member 9 is approximately linear, and the temperature coefficient the electric resistivity is, for example, +0.3 (%/K). The resistance of the temperature monitor member 9 is set approximately the same as the resistance of the temperature monitor member 8, for example, several thousand to several ten thousand Ω, e.g., 25 kΩ. The temperature monitor member 9 has a quadrilateral sheet-like shape as seen from the direction perpendicular to the top surface of the P-type silicon substrate Psub, with one side having a length of, for example, 1 to 100 μm and a thickness of, for example, 0.1 to 0.3 μm. The opposite two sides of the temperature monitor member 9 are respectively provided with electrodes (not shown) one of which is connected to the via V15. The temperature monitor member 9 is provided at the same layer as the wires W1, W2, W4, W5 and W11.

Further, a via V18 is provided on the temperature monitor member 9 in such a way as to be connected to the other electrode (not shown) of the temperature monitor member 9. The power-source potential wire Vcc is provided on the via V18 in such a way as to be connected to the via V18.

That is, the via V11, the wire W11, the via V12, the wire W12, the via V13, the temperature monitor member 8, the via V114, the wire W13, the via V15, the temperature monitor member 9, and the via V18 are connected in series in the named order from the p+ diffusion region P4 toward the power-source potential wire Vcc. The p+ diffusion region P4 is connected to the ground potential wire GND of the logic circuit section 2 through the P-type silicon substrate Psub, the p+ diffusion region P3, the via V8, the wire W5, and the via V9.

As the semiconductor integrated circuit device 1 according to the embodiment is constructed in the above-described manner, a circuit having the temperature monitor member 9 and the temperature monitor member 8 connected in series in the named order from the power-source potential wire Vcc toward the ground potential wire GND is formed in the temperature sensor section 3 as shown in FIG. 2. Accordingly, the ground potential is applied to one end portion of the temperature monitor member 8 whose other end portion is connected to one end portion of the temperature monitor member 9 through the wire W13. The power-source potential is applied to the other end portion of the temperature monitor member 9. The output terminal Vout1 is connected to the node between the temperature monitor member 9 and the temperature monitor member 8.

In the multi-layer wiring layer M1, the vias V1, V3, V4, V6, V8 and V11 are provided in the first insulating layer in which the gate electrodes G1 and G2 are provided. The wire W1, W2, W4, W5 and W11 and the temperature monitor member 9 are provided in the first wiring layer provided on the first insulating layer, and the vias V2, V5, V7, V9, V12, V15 and V18 are provided in the second insulating layer provided on the first wiring layer. Each ground potential wire GND, each power-source potential wire Vcc, and the wires W3, W12 and W13 are provided in the second wiring layer provided on the second insulating layer. The vias V13 and V14 are provided in the insulating layer 15 provided on the multi-layer wiring layer M1. The temperature monitor member 8 is provided at the sheet layer 16 provided on the insulating layer 15. Those portions of the multi-layer wiring layer M1, the insulating layer 15, and the sheet layer 16 which exclude the individual vias, the individual wires and the temperature monitor members 8 and 9, and the upper layer of the temperature monitor member 8 are buried with an insulating material 7. The vias are formed of, for example, tungsten (W), while the wires are formed of, for example, aluminum (Al).

As mentioned above, the logic circuit section 2 is provided at the P-type silicon substrate Psub and the multi-layer wiring layer M1 in the semiconductor integrated circuit device 1, not at the insulating layer 15 and the sheet layer 16 which lie above the multi-layer wiring layer M1. The temperature monitor member 8 of the temperature sensor section 3 is provided at the sheet layer 16.

A manufacture method for the semiconductor integrated circuit device 1 will now be discussed referring to FIG. 1. In the embodiment, after the N well NW1 and the P well PW1 and the n$^+$ diffusion regions N1 and N2 and the p$^+$ diffusion regions P1 to P4 are formed at the top surface of the P-type silicon substrate Psub by the ordinary method, the multi-layer wiring layer M1 is formed from the bottom layer to an upper one. At this time, the temperature monitor member 9 is formed at the same level as the wires W1, W2, W4, W5 and W11. Then, the insulating layer 15 is formed on the multi-level wiring layer M1, and the vias V13 and V14 are formed in the insulating layer 15. Thereafter, a vanadium oxide layer is formed on the insulating layer 15 by sputtering, and is patterned to form the temperature monitor member 8. Next, the temperature monitor member 8 is buried with the insulating material 7, thereby forming the sheet layer 16. This completes the fabrication of the semiconductor integrated circuit device 1 according to the embodiment.

The operation of the semiconductor integrated circuit device 1 according to the embodiment with the above-described structure will be discussed below. When the ground potential is applied to the ground potential wire GND and the power-source potential is applied to the power-source potential wire Vcc, the potential of the output terminal Vout1 takes a value between the ground potential and the power-source potential, which is the voltage-dividing potential determined by the resistance of the temperature monitor member 8 and the resistance of the temperature monitor member 9. When the outside temperature rises or the temperature of the semiconductor integrated circuit device 1 rises due to the heat generated by the logic circuit section 2 driven, the temperatures of the temperature monitor members 8 and 9 rise too, so that the resistance of the temperature monitor member 8 decreases and the resistance of the temperature monitor member 9 increases. Because the temperature coefficient of the resistivity of the vanadium oxide constituting the temperature monitor member 8 is, for example, −2.0 (%/K) and the temperature coefficient of the resistivity of Ti constituting the temperature monitor member 9 is, for example, +0.3 (%/K) at this time, the potential of the output terminal Vout1 changes at a rate of −2.3 (%/K) as the temperature rises by 1° C. Then, the temperature of the semiconductor integrated circuit device 1 is measured by detecting the potential of the output terminal Vout1.

The logic circuit section 2 is controlled based on the result of measuring the temperature. When the measured temperature exceeds a predetermined value, for example, it is decided that the logic circuit section 2 is overheated, so that driving of the logic circuit section 2 is stopped. Apparently, the temperature monitor members 8 and 9 are used as dividing resistances in the embodiment.

In the embodiment, the temperature monitor member 8 is provided at the sheet layer 16 lying above the multi-layer wiring layer M1, and the logic circuit section 2 is not provided at the sheet layer 16 but provided at a wiring layer lying under the sheet layer 16, so that the logic circuit section 2 is not contaminated by vanadium oxide. Neither is the semiconductor manufacture equipment that manufacture the P-type silicon substrate Psub and the multi-layer wiring layer M1. Existing macros can be used for the logic circuit section 2. Because the temperature monitor member 8 is formed after forming the logic circuit section 2, the logic circuit section 2 can be formed by the conventional manufacture process. With regard to the logic circuit section 2, therefore, the existing platform need not be changed. This can suppress an increase in manufacturing cost which is originated from the provision of the temperature monitor member 8.

The temperature coefficient of the electric resistivity of vanadium oxide is about −2.0 (%/K), and the temperature coefficient of the electric resistivity of titanium is about +0.3 (%/K), so that when the resistances of the temperature monitor members 8 and 9 are approximately equal to each other, the absolute value of a change in the potential of the output terminal Vout1 becomes about −2.3 (%/K). As the value is considerably greater than 0.2 (%/K) which is the temperature coefficient of the resistivity of the parasitic pn junction diode, a high SNR can be acquired at the time of measuring the temperature. Because the vanadium oxide is chemically stable, the reliability of the temperature sensor section 3 can be improved. This results in an improvement of the reliability of the semiconductor integrated circuit device 1.

The logic circuit section 2 can be controlled adequately based on the temperature measuring result of the temperature sensor section 3. For example, the logic circuit section 2 can be prevented from being damaged by overheating.

Although the temperature monitor member 9 is formed of Ti in the embodiment discussed above, the present invention is not limited to this particular case. In general, the electric resistivities of metals or alloys take positive temperature coefficients, so that such can be used as the material for the temperature monitor member 9. For example, beside Ti, one metal selected from a group of aluminum (Al), nickel (Ni), tungsten (W), tantalum (Ta) and beryllium (Be) or an alloy of the metal, or an alloy essentially consisting of two or more metals selected from the group are preferable. When the wires W1, W2, W4, W5 and W11 are formed of Al, for example, the temperature monitor member 9 can be formed at the same time as the wires W1, W2, W4, W5 and W11, if the temperature monitor member 9 is formed of Al. Alternatively, the temperature monitor member 9 may be formed of TiN.

Although the temperature monitor member 9 is provided at the lowermost wiring layer of the multi-layer wiring layer M1 in the embodiment, the present invention is not limited to this case. The temperature monitor member 9 may be formed at any wiring layer as long as it is in the multi-layer wiring layer M1.

As the temperature dependence of the electric resistivity of vanadium oxide that forms the temperature monitor member 81 is non-linear, the temperature dependence of the potential of the output terminal Vout1 can be set in such a way as to get larger in the measuring temperature range.

Although the temperature sensor section 3 is formed at a region different from the region where the logic circuit section 2 is formed in the embodiment, the temperature monitor member 8 may be formed at least at a part of a region lying directly above the logic circuit section 2 in the present invention. That is at least a part of the logic circuit section 2 may be arranged at a region lying directly under the temperature monitor member 8. This can ensure effective use of the region lying directly under the temperature monitor member 8, reducing the required space and reducing the layout area of the semiconductor integrated circuit device 1. This can contribute to miniaturization of the device.

The temperature sensor sections 3 may be formed at one location of a chip where the semiconductor integrated circuit device 1 is formed, or may be formed at a plurality of locations of the chip respectively. For example, the temperature sensor sections 3 may be formed at the center portion and four corners of the chip, i.e., at a total of five locations. As the temperature sensor sections 3 are respectively provided at a plurality of locations and the average value of the measurements of the individual temperature sensor sections 3 is computed, the accuracy of the temperature measurement can be improved further.

Although a single temperature monitor member 8 and a single temperature monitor member 9 are provided in the embodiment, the present invention is not limited to this case and a plurality of temperature monitor members 8 and a plurality of temperature monitor members 9 may be provided. In this case, while it is preferable to provide a plurality of temperature monitor members 8 at the topmost layer of the semiconductor integrated circuit device 1, the temperature monitor members 8 may be provided respectively at the topmost layer of the semiconductor integrated circuit device 1 and layers lying under the topmost layer to reduce the layout area. In this case, however, the temperature monitor members 8 should be provided above the multi-layer wiring layer M1 where the logic circuit section 2 is provided. Further, the quantities of the wiring layers and the insulating layers in the multi-layer wiring layer M1 are not particularly restrictive.

Figure 4:
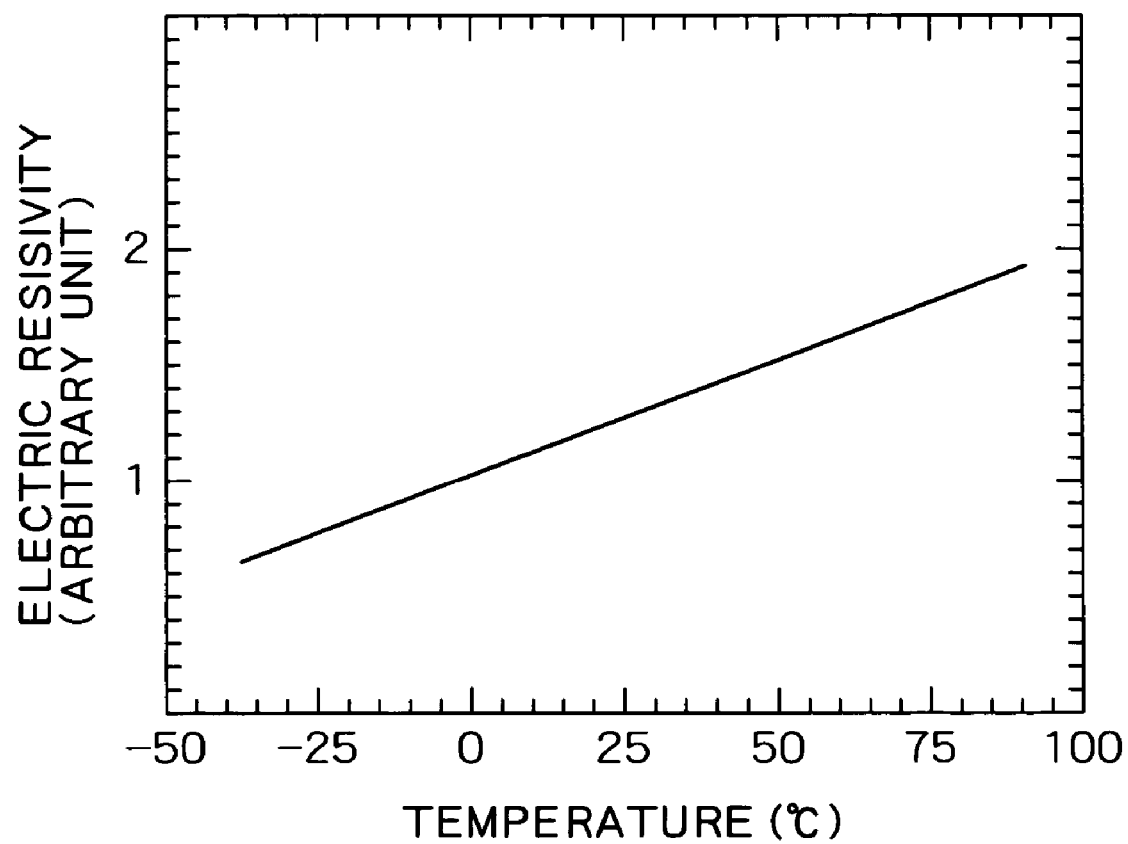
FIG. 4 is a graph showing the temperature dependence of the electric resistivity of titanium nitride, showing the temperature on the abscissa and the electric resistivity of titanium nitride on the ordinate.

A modification of the first embodiment will be discussed below. FIG. 4 is a graph showing the temperature dependence of the electric resistance of titanium nitride (TiN), showing the temperature on the abscissa and the electric resistance of titanium nitride on the ordinate. In the modification, the temperature monitor member 9 is formed of TiN, and the temperature dependence of the electric resistivity of TiN is linear as shown in FIG. 4. That is, the higher the temperature is, the greater the electric resistivity of TiN becomes, but the inclination or the temperature coefficient of the electric resistivity takes a nearly constant positive value regardless of the temperature. The other structure, operation and effects of the modification are the same as those of the first embodiment.

Figure 5:
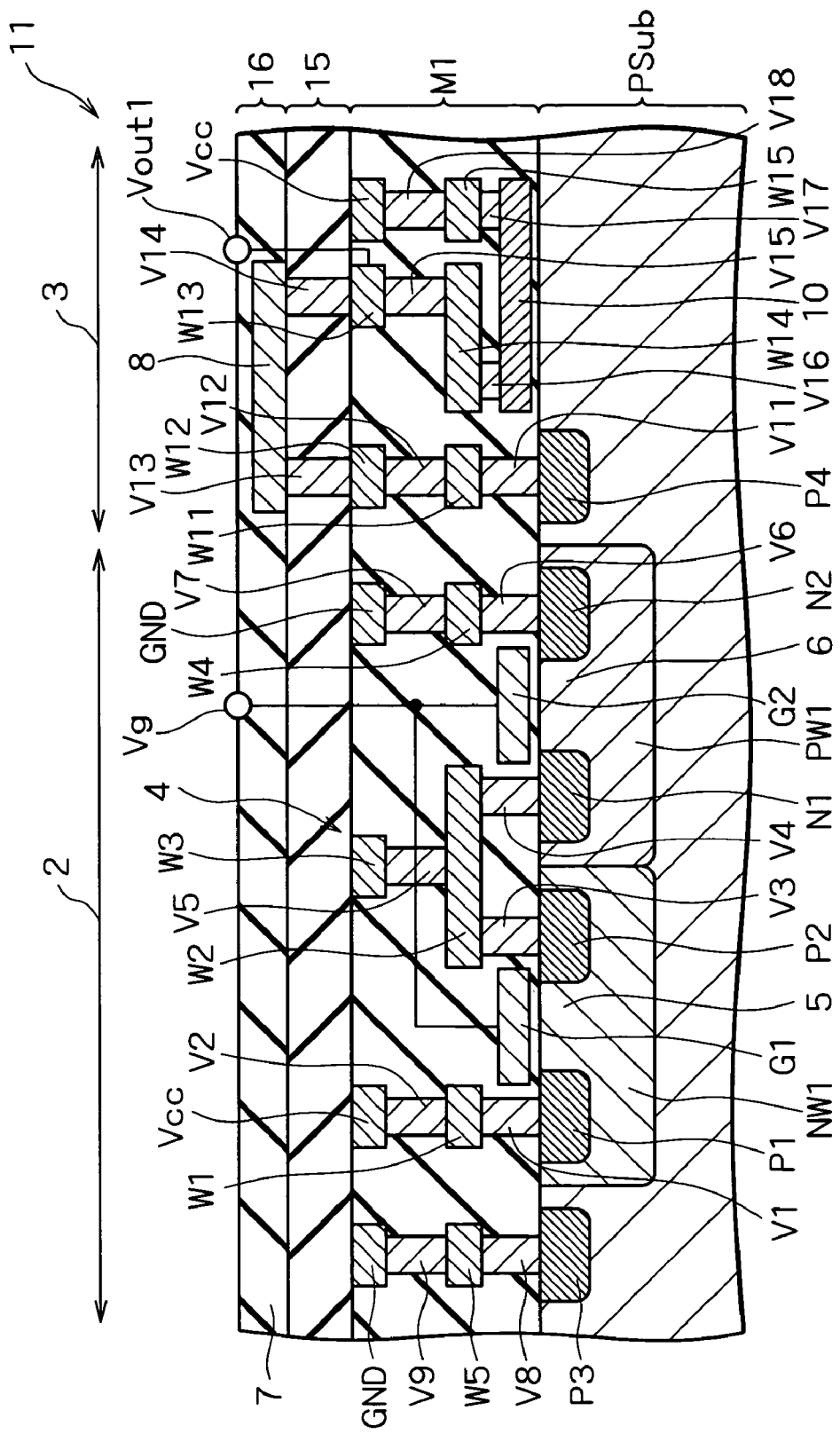
FIG. 5 is a cross-sectional view showing a semiconductor integrated circuit device according to a second embodiment of the invention.

A second embodiment of the present invention will now be described. FIG. 5 is a cross-sectional view showing a semiconductor integrated circuit device according to the second embodiment. As shown in FIG. 5, the semiconductor integrated circuit device 11 according to the embodiment is provided with a temperature monitor member 10 formed of barium strontium titanate (BST) or barium titanate in place of the temperature monitor member 9 (see FIG. 1). The temperature monitor member 10 is provided below the wires W1, W2, W4, W5 and W11.

That is, a wire W14 is provided under the via V15 in such a way as to be connected to the via V15, and a via V16 is provided under the wire W14 in such a way as to be connected to the wire W14. The temperature monitor member 10 is provided under the via V16, and one end portion of the temperature monitor member 10 is connected to the via V16. A via V17 is provided on the temperature monitor member 10 whose other end portion is connected to the via V17. A wire W15 is provided on the via V17 in such a way as to be connected to the via V17, and is connected to a via V18. The other structure and operation of the embodiment are the same as those of the first embodiment.

Barium strontium titanate or barium titanate can be expressed by the chemical formula $Ba_{1-x}Sr_xTiO_3$ where x is a value equal to or greater than 0 and less than 1. When x=0, it is barium titanate. Hereinafter, barium strontium titanate and barium titanate are generally called BST. The temperature coefficient of the electric resistivity of a thin film of BST, which differs according to the composition of the thin film or the value of x and the deposition method, is +2.0 (%/K), for example.

In manufacturing the semiconductor integrated circuit device 11 according to the embodiment, the temperature monitor member 10 of BST is formed before the wires W1, W2, W4, W5 and W11 of Al are formed. After the formation of the temperature monitor member 10, the vias V16 and V17 are formed in such a way as to be connected to both end portions of the temperature monitor member 10. Then, the wires W1, W2, W4, W5 and W11 are formed at which time the wires W14 and W15 are also formed. The other manufacture method of the embodiment is the same as that of the first embodiment.

As the temperature monitor member 10 is formed of BST whose electric resistivity has a greater temperature coefficient than that of Ti according to the embodiment, the temperature measuring accuracy can be improved more as compared with the first embodiment. As the deposition temperature of the BST film is high, for example, 550° C., forming the temperature monitor member 10 after the formation of the wires of Al may adversely affect the wires. Because the temperature monitor member 10 is formed before the wires in the embodiment, however, the temperature monitor member 10 does not adversely affect the wires. The other effects of the embodiment are the same as those of the first embodiment.

What is claimed is:

1. An integrated circuit device comprising:
    a semiconductor substrate;
    a multi-layer wiring layer provided on said semiconductor substrate;
    a first temperature monitor member having a first end portion and a second end portion being provided on a layer overlying said multi-layer wiring layer, an electric resistivity of said first temperature monitor member having a negative temperature coefficient;
    a second temperature monitor member having a first end portion and a second end portion, said first end portion of said second temperature monitor being connected to said second end portion of said first temperature monitor member, an electric resistivity of said second temperature monitor member having a positive temperature coefficient;
    a first terminal connected to said first end portion of said first temperature monitor member, said first terminal being applied a first reference potential;
    a second terminal connected to said second end portion of said second temperature monitor member, said second terminal being applied a second reference potential different from said first reference potential; and
    a third terminal connected to said second end portion of said first temperature monitor member and said first end portion of said second temperature monitor member, said third terminal outputting a voltage indicating a temperature of said integrated circuit device,
    wherein said first temperature monitor member, said second temperature monitor member, said first terminal, said second terminal and said third terminal comprise a temperature monitor circuit.

2. The integrated circuit device according to claim 1, wherein a temperature dependence of said electric resistivity of said first temperature monitor member is non-linear, and a temperature dependence of said electric resistivity of said second temperature monitor member is linear.

3. The integrated circuit device according to claim 1, wherein said first temperature monitor member is formed of vanadium oxide.

4. The integrated circuit device according to claim 1, wherein said second temperature monitor member is formed of a metal or an alloy.

5. The integrated circuit device according to claim 4, wherein said second temperature monitor member is formed of one metal selected from a group consisting of Al, Ti, Ni, W, Ta and Be, or an alloy of said metal, or an alloy essentially consisting of two or more metals in said group.

6. The integrated circuit device according to claim 1, wherein said second temperature monitor member is formed of TiN.

7. The integrated circuit device according to claim 1, wherein said second temperature monitor member is formed of barium strontium titanate or barium titanate.

8. The integrated circuit device according to claim 7, wherein said second temperature monitor member is laid out below a lowermost wiring layer of said multi-layer wiring layer.

9. The integrated circuit device according to claim 1, further comprising a logic circuit section formed at said semiconductor substrate and said multi-layer wiring layer.

10. The integrated circuit device according to claim 1, wherein said second temperature monitor is formed in a layer of said multi-layer wiring layer.

* * * * *